US012635073B2

(12) United States Patent (10) Patent No.: US 12,635,073 B2
Gavagnin (45) Date of Patent: May 19, 2026

(54) COMPONENT CARRIER

(71) Applicant: AT & S Austria Technologie & Systemtechnik AG, Leoben (AT)

(72) Inventor: Marco Gavagnin, Leoben (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 262 days.

(21) Appl. No.: 18/124,414

(22) Filed: Mar. 21, 2023

(65) Prior Publication Data

US 2023/0319989 A1 Oct. 5, 2023

(30) Foreign Application Priority Data

Mar. 31, 2022 (EP) .................................... 22165947

(51) Int. Cl.
H05K 1/11 (2006.01)
H05K 1/182 (2026.01)
(52) U.S. Cl.
CPC .............. H05K 1/11 (2013.01); H05K 1/182 (2013.01); *H05K 2201/026* (2013.01); *H05K 2201/09227* (2013.01); *H05K 2201/10287* (2013.01); *H05K 2201/10378* (2013.01)
(58) Field of Classification Search
CPC ..................... H05K 1/11; H05K 1/182; H05K 2201/09227; H05K 2201/10287; H05K 2201/10378; H05K 3/462; H05K 2201/026; H05K 3/4652; H05K 1/119
See application file for complete search history.

(56) References Cited

U.S. PATENT DOCUMENTS

| | | | |
|---|---|---|---|
| 5,481,795 A | 1/1996 | Hatakeyama et al. | |
| 9,545,017 B2 | 1/2017 | Hunrath et al. | |
| 2006/0071334 A1* | 4/2006 | Kawabata ......... | H01L 21/76805 257/E21.586 |
| 2006/0081989 A1* | 4/2006 | Uang ..................... | H05K 3/323 257/753 |
| 2006/0113656 A1* | 6/2006 | Uang ................ | H01L 23/49894 257/E23.072 |
| 2008/0146071 A1 | 6/2008 | Davoine et al. | |
| 2008/0227294 A1 | 9/2008 | Suh | |
| 2011/0039459 A1 | 2/2011 | Yancey | |
| 2011/0186339 A1 | 8/2011 | Bai et al. | |
| 2012/0257343 A1 | 10/2012 | Das et al. | |
| 2018/0166372 A1* | 6/2018 | Shimizu .............. | H05K 3/4644 |

(Continued)

FOREIGN PATENT DOCUMENTS

| | | |
|---|---|---|
| DE | 102006031322 A1 | 9/2007 |
| DE | 102017126724 A1 | 5/2019 |

(Continued)

OTHER PUBLICATIONS

"Extended European Search Report for Application No. EP22165947, mailed on Jul. 10, 2022".

*Primary Examiner* — Steven T Sawyer
(74) *Attorney, Agent, or Firm* — ALG Intellectual Property, LLC

(57) ABSTRACT
Described herein are a component carrier, wherein the component carrier comprises: a stack comprising a plurality of electrically conductive layer structures and at least one electrically insulating layer structure, wherein at least two of said electrically conductive layer structures are connected through a plurality of (electrical) conductive nanowires.

13 Claims, 4 Drawing Sheets

(56)        References Cited

U.S. PATENT DOCUMENTS

| | | | |
|---|---|---|---|
| 2019/0103378 A1 | 4/2019 | Escher-Poeppel et al. | |
| 2019/0319006 A1* | 10/2019 | Hung ..................... | H01L 24/05 |
| 2020/0279821 A1* | 9/2020 | Haba ....................... | H01L 24/03 |
| 2020/0321304 A1* | 10/2020 | Summerfelt ............ | H01L 24/32 |
| 2020/0359465 A1 | 11/2020 | Barako et al. | |

FOREIGN PATENT DOCUMENTS

| | | |
|---|---|---|
| DE | 102018122007 A1 | 3/2020 |
| EP | 3592696 A1 | 1/2020 |
| EP | 3711462 A1 | 9/2020 |
| WO | 2018162681 A1 | 9/2018 |
| WO | 2019096770 A1 | 5/2019 |

* cited by examiner a)

10

16,16a  14  18  14 b)

16,16a  18 c)

16a  18

16b  14a c)

e-aa)

e-ab)

14d d)

a e-ba)

b e-bb)

d-ba)

14

26

22a

20

22b z

COMPONENT CARRIER

RELATED APPLICATIONS

The present application claims priority to EP patent application Ser. No. 22/165,947.7, filed Mar. 31, 2022, the contents of which are hereby incorporated by reference in their entirety.

BACKGROUND INFORMATION

Circuit boards are used in a wide range of applications. Those need to be adapted depending on the application. For some application it is necessary to connect circuit boards or to provide circuit boards having circuit structures provided on different levels, some even exploiting different technologies, which level may be interconnected. In particular, there is a need for component carriers having three-dimensional electrical connections, with higher flexibility compared to conventional via interconnect.

BRIEF DESCRIPTION OF THE DRAWINGS

Below, embodiments are described in more detail with reference to the attached drawings.

The reference symbols used in the drawings, and their meanings, are listed in summary form in the list of reference symbols. In principle, identical parts are provided with the same reference symbols in the figures.

DETAILED DESCRIPTION

Figure 1:
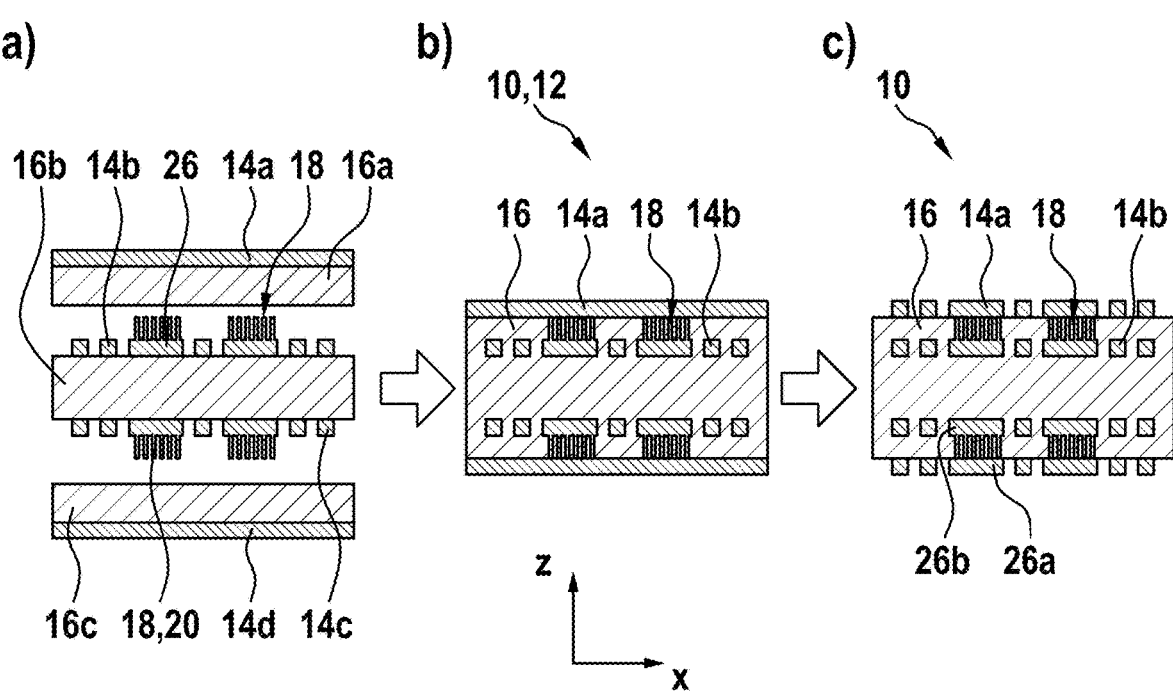
FIG. 1 shows a lamination and structuring process for a component carrier.

Described herein are features of a component carrier.

The embodiments described herein overcome the above-mentioned problems.

An aspect relates to a carrier assembly. The component carrier may comprise a stack comprising a plurality of electrically conductive layer structures and at least one electrically insulating layer structure, wherein at least two of said electrically conductive layer structures are connected through a plurality of (electrical) conductive nanowires. The electrically conductive layer structures might be in particular parallel layer structures.

The main advantage is to connect two separately manufactured carriers. This might be needed to increase the yield e.g. in case of high layer number or carriers with and without embedding, or combine two carriers based on different technologies e.g. RF and digital requiring a different material base. Another advantage is to obtain asymmetric stack-ups, as usually the sequential lamination is done using layers with same thickness on both sides of the carrier avoiding unbalanced configurations leading to warpage. The connections through nanowires allow a reliable and easy connection between two opposed electrically conductive layer structures in a component carrier stack, without the need of additional known steps on the stack to provide this electrical connection, for example to provide connecting vias, pillar or similar.

The use of conductive nanowires to connect two frontal electrically conductive layer structures provided on a stack does not need precise alignment of said two electrically conductive layer structures, because the high population resulting from the plurality of nanowires allow the connection of the majority of these nanowires with both structures; at the same time, if the majority of these nanowires connected, the required electrically connection between said electrically conductive layer structures is fulfilled. Another advantage is the via dimension decrease as there is not limitation by the capturing pad which is needed for laser drilling via formation. Additionally, a via on track can be realized.

A layer can be a continuous layer or be constructed by layer sections arranged in a plane. In particular, an electrically conductive layer structure may comprise conductive and non-conductive areas. An electrically conductive layer structure and an insulating layer structure may be formed by coating a conductive layer on an insulating layer or vice-versa. The component carrier may in particular comprise for example a resin coated copper (RCC) or a glass fiber-free resin sheet or ABF foil and a copper foil. The electrically conductive nanowires are in particular metallic nanowires, in particular copper nanowires. Metallic nanowires provide a good mechanical stability and a good electrical conductivity. This component carrier may constitute a stack of at least two printed circuit boards (PCB).

According to an embodiment, each nanowire has two extremities, one extremity being connected to a surface of one of said at least two of said electrically conductive layer structures, the other extremity being connected to a surface of the other of the at least two of said electrically conductive layer structures, said two surfaces facing one each other. From one extremity to the other extremity, the nanowire extends with a length and is provided with a diameter, wherein diameter is understood to be the maximal extension in the cross-section of the nanowire. The diameter may change along the length of the nanowire.

In particular, the nanowire is linear or has a curve like shape from one extremity to the other extremity. In particular, the nanowire might have an aspect ratio of length to diameter of 2:1, in particular 25:1, in particular 50:1, in particular the nanowire has an elongated structure. A cross-section of the nanowire may be round, e. g. circular, elliptic or oval or non-round, e. g. triangular, square, hexagon. The cross-section may change along the length of the nanowire or be uniform. The cross-section may in particular change concerning its diameter, in particular taper, such that the nanowire might have a cone like or pyramidal shape. An example for a nanowire having a uniform diameter is a nanowire having a cylindrical shape.

In particular, a first extremity of one nanowire is connected to a surface of the first electrically conductive layer and the second extremity is connected to a facing surface of the second electrically conductive layer. Thus, the nanowire forms a mechanical and/or electrical connection between the two conductive layers. A distance between the facing surfaces, being in particular parallel surfaces, is in particular about or exactly equal the length of the nanowire.

According to an embodiment, the first extremity of at least one nanowire is bonded with one of the at least two of said electrically conductive layer structures.

According to an embodiment, the second extremity of at least one nanowire is bonded with the other one of the at least two of said electrically conductive layer structures. Bonding one or both extremities with a respective surface forms a reliable mechanical and electrical connection. There are different known techniques for bonding nanowire. In particular, the bonding is conducted by applying pressure and an elevated temperature and/or applying ultrasonic vibrations.

According to an embodiment, the first and/or the second extremity of at least one nanowire is bonded with the one and/or the other one of the at least two of said electrically conductive layer structures so that the first and/or the second extremity is/are inserted in the one and/or the other one of the at least two of said electrically conductive layer structures. Thus, one of the extremities of the nanowire is inserted in the surface of the respective electrically conductive layer structure facing the surface of the other electrically conductive layer structure. This allows for a better mechanical interconnection and a reliable electrical connection. Nanowire and surface may be formed from different materials.

According to an embodiment, at least one of the extremities of at least one nanowire monolithically merges from one of said at least two of said electrically conductive layer structures. In particular, a monolithically merging nanowire can be grown from the surface of the electrically conductive layer structures and/or may be formed from the same material as the electrically conductive layer structures. Monolithically merging nanowires show a good structural stability of their connection to the layer structure. The nanowire is homogeneous with the electrically conductive layer structure also concerning other parameters as the thermal expansion coefficient, chemical resistance etc.

According to an embodiment, said plurality of nanowires are each connected to and/or bonded to and/or monolithically merged from the same at least one electrically conductive structure. A strong mechanical connection is established between the plurality of nanowires and the at least one electrically conductive structure.

According to an embodiment, said plurality of nanowires are each connected to and/or bonded to and/or monolithically merged from two of said electrically conductive structures. Alternatively, at least one nanowire abuts against at least a portion of one of said electrically conductive layer structures. In some examples, each nanowire has a free extremity abutting against a portion of the electrically conductive structure, e.g., facing the electrically conductive structure from which the nanowire is connected and/or bonded and/or monolithically merged. This allows for an easier manufacturing of the component carrier, where the need of the bonding of the free extremity of the nanowire, e.g., of all nanowires, need not to be bonded with a further electrically conductive structure.

According to an embodiment, at least one nanowire connects two areas each provided on one of said two electrically conductive structures. In some examples, these areas face one each other. The two areas may be separated by an insulating layer structure. The insulating layer structure provides a reliable insulation among these two areas resp. electrically conductive structure.

In particular, at least one of said two areas is offset in the stack thickness direction with respect to the main area of the respective electrically conductive structure. In some examples, the at least one area protrudes from the respective electrically conductive structure toward the other electrically conductive structure where said plurality of nanowires are connected to and/or bonded to and/or monolithically merged. In particular, this area has an increased thickness, which allows for example an insertion of the nanowires in the conductive structure. Such an embodiment reduces the distance between two electrically conductive structures and allows shorter nanowires and assure that all nanowires are connected to this protruding area.

According to an embodiment, said two areas extend along a closed profile, so that the plurality of nanowires encloses an internal area. The profile is in particular parallel to the planar extension of the electrically conductive structures. In particular, the profile may be a square, oval, circular, rectangular profile. The internal area may be a non-conductive area surrounded by the nanowires. The area surrounded by the nanowires might form a cavity in the component carrier. Thus, a cavity is formed without the need of further/tailored process steps to create this cavity, such as routing or other known processes. Such an embodiment might further be used substituting a copper trench filling process.

According to an embodiment, the plurality of nanowires is divided in at least two sub-pluralities of nanowires, e.g., each sub-plurality connects two sub-areas each provided on one of two electrically conductive layer structures. Optionally, between the at least two electrically conductive structures an electrically insulating layer structure is provided, delimited by the area enclosed by said nanowires.

According to an embodiment, the stack comprises at least three of electrically conductive layer structures divided by at least two electrically insulating layer structures, wherein the central electrically conductive layer structures provided between the other two external electrically conductive layer structures comprises two opposed surfaces, wherein at least a plurality of nanowires is provided on one of said opposed surfaces and at least a further plurality of nanowires is provided on the other opposed surface. Such an embodiment allows to connect electrically conductive structures in different positions with respect to a thickness direction and/or a planar extension of the layers. The stack might include one or more central electrically conductive layer structures. The central electrically conductive structures can be also composed of a central dielectric layer and two opposed electrically conductive structures. The central electrically conductive structures may alternatively be composed by electrically conductive and electrically insulating structures, wherein the electrically conductive structures may be arranged to be contacted from both sides of the layer in a thickness direction. Said at least a plurality of nanowires is connected to one external electrically conductive layer structures and the central electrically conductive layer structures, wherein e.g., the at least a further plurality of nanowires is provided on the other opposed surface of the central electrically conductive layer structure and connected to the other external electrically conductive layer structures.

The area of the at least a plurality of nanowires and the area of the at least a further plurality of nanowires may be vertically aligned one each other. Vertically is supposed to be vertical with respect to the surface of the layer structures or in other words aligned with a thickness direction of the stack. Due to the vertical alignment short nanowires allow to connect the opposed areas.

Additionally, the area of the at least a plurality of nanowires and the area of the at least a further plurality of nanowires may be vertically at least partially offset one each other. Thus, the nanowires are arranged in a z-like or step-like shape. This allows for example to compensate for registration tolerances or to connect a pair of opposed areas or electrically conductive structures only partially overlapping one each other along the carrier thickness direction.

The at least a plurality of nanowires and the least a further plurality of nanowires may be each connected to a conductive base and a further conductive base respectively, said bases being connected one each other. A conductive base might be provided on the opposed surfaces with a chosen thickness. This thickness might be chosen independently from the layer thickness. The connection between the two bases may be formed by microvias, conductive pillars, or vertical electrical connections. Such a conductive base and further conductive base may be provided as an inset in a dielectric or insulating layer and form the above-mentioned areas.

According to an embodiment, an electrically insulating layer structure is provided between the at least two electrically conductive structures, said plurality of nanowires being embedded in said electrically insulating layer structure. Due to the embedding, the nanowires are stable positioned. The embedding further provides an insulation. For example, the electrically insulating structure can be a resin, i.e. ABF. The nanowires are inserted when said resin is soft and then not cured, for example in a temperature in the range between 90° C. and 160° C., e.g., between 120° C. and 140° C. (warmed for example with a heating rate of 5K/min). Only after the insertion the resin may be cured and those stabilize and/or embed the nanowires.

Optionally, between the at least two electrically conductive structures an electrically insulating layer structure is provided, delimited by the area enclosed by said nanowires. For example, prepreg sections may be provided which are cut to fit into areas enclosed by the nanowires or are provided with one or more through holes. On one hand side, these structures may be used for keeping the electrically conductive structures in a defined distance to each other and/or on the other hand may be used for laminating the electrically conductive structures to a stack.

According to an embodiment, said plurality of nanowires comprises a plurality of vertically nanowires. A "vertical nanowire" extends vertically resp. perpendicularly from a planar surface of the electrically conductive layer structures, in particular vertical from a planar layer. In particular, if the electrically conductive layer structures connected with the nanowires are parallel to each other, a vertical nanowire connects opposing areas along the shortest distance between the electrically conductive layer structures.

According to an embodiment, said plurality of nanowires comprises an array of nanowires within a specific distribution area. Thus, a regular distribution of the nanowires is provided in the distribution area. This embodiment provides a good definition of the space between the nanowires.

Alternatively, said plurality of nanowires are randomly distributed within a specific distribution area. A random distribution may be used in particular for nanowires growing from a porous layer having a randomly distributing pores. This embodiment has the advantage to be manufactured by an easier manufacturing process.

According to an embodiment, said area, in particular planar area or specific area having a planar surface, where the respective plurality of nanowire is provided has a planar shape with a roughness of at least the value of a nanowire diameter.

According to an alternative embodiment, the ratio between the area occupied by the nanowires and the entire area of at least one plurality of nanowires is in the range between 10% and 90%, e.g., from 10% and 30%. This enhances the connection between the two opposed areas/electrically conductive structures.

According to an embodiment, each of said plurality of nanowires has an average diameter in the range of 10 nm to 5 μm and/or has an average length in the range of 30 nm to 100 μm, e.g., 300 nm to 20 μm. In particular, the length of the nanowire may be related to its thickness, meaning nanowires having a larger thickness allow a higher length. As an example, nanowire having a 300 nm diameter can achieve up to 1-5 μm in length or having a 1 μm diameter can allow up to 50 μm in length.

According to an embodiment, one of the two electrically conductive structures connected by the nanowires comprises a component conductive area, e.g., a component pad. The nanowires may connect the electrically conductive structure with the component, in particular with the component pad. Thus, a direct connection to a component is established, enhancing the electrical and mechanical connection, and reducing the necessary process steps to connect the component. A component might be an active electronic component (having at least one p-n-junction implemented, e. g. a diode), a passive electronic component such as a resistor, an interposer, or other known components.

According to an embodiment, the component carrier is manufactured by a lamination process. In a first step, a plurality of electrically conductive layer structure and at least one electrically insulating layer structure is provided. The plurality of electrically conductive layer structure and the at least one electrically insulating layer structure are arranged in a stack. In a subsequent lamination step, the plurality of nanowires arranged on one of the electrically conductive layer structures is brought into contact with another of the electrically conductive layer structures. In the lamination, the layer structures are permanently connected to each other. The laminated stack might be submitted to structuring and/or etching and/or plating steps.

These and other aspects will be apparent from and elucidated with reference to the embodiments described hereinafter.

FIG. 1 shows the build-up of a component carrier 10 in an embodiment. FIG. 1a shows the individual layer structures. FIG. 1b shows the laminated stack and FIG. 1c shows the structured stack. The component carrier 10 comprises a stack 12, comprising a plurality of electrically conductive layer structures 14 and at least one electrically insulating layer structure 16, wherein at least two of said electrically conductive layer structures 14 are connected through a plurality of (electrical) conductive nanowires 18 as shown in FIG. 1c. In FIG. 1a each conductive layer structure 14 is attached to an electrically insulating layer structure 16. In this embodiment there are the electrically insulating layer structures 16a, 16b and 16c. The electrically insulating layer structures 16 may be for example resin layers, a glass fiber free resin sheet, or core layer or an ABF material. The conductive layer structures 14, here 14a to 14d, may be for example a copper sheet resp. copper foil. In this embodiment, the middle electrically insulating layer structure 16b is provided with a conductive layer structure 14 on a top side and on a bottom side, thus on the opposing surfaces. Both conductive layer structure 14b, 14c attached to middle electrically insulating layer structure 16b are structured. A plurality of nanowires 18 is connected with the conductive layer structure 14 attached to middle electrically insulating layer structure 16b, in particular to the conductive layer structure 14b and 14c. The plurality of nanowires 18 is arranged in areas 26. The plurality of nanowires 18 extend towards a top and a bottom. By stacking and/or laminating the layers together, the plurality of nanowires 18 gets into contact with the top and bottom conductive layer structure 14a, 14d, in particular a back side of the respective copper foil and protrudes through the electrically insulating layer structure 16a and 16c respectively, as depicted in FIG. 1b.

The plurality of nanowires is aligned vertically. The top and bottom conductive layer structure 14a and 14c may be structured afterwards as depicted in FIG. 1c. In this structures stack, at least one nanowire 20 connects two areas 26a and 26b. The structuring can be conducted with a known PCB (printed circuit board) process.

Figure 2:
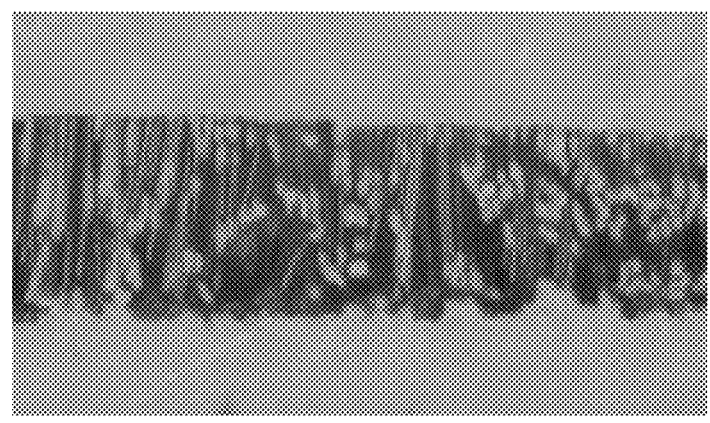
FIG. 2 shows a micrograph side view of the structured component carrier.

FIG. 2 shows a micrograph of a structured component carrier. The micrograph shows on the bottom an electrically conductive layer with a smooth (upper) surface. Nanowires are protruding from the smooth surface in an upward direction. On top of the nanowires a rough metal foil, here copper foil, is arranged. The rough metal foil is stacked on the top of the nanowires. The nanowires are at least partially bent and at least some of the nanowires touch other nanowires.

Figure 3:
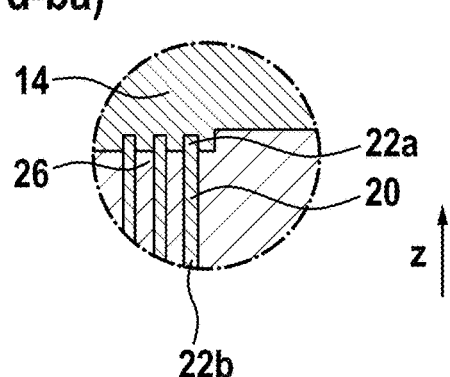
FIG. 3 shows an alternative process for the manufacturing of the component carrier.

FIG. 3 shows an alternative structuring process for the component carrier. The diagram starts in FIG. 3a with the second step as of FIG. 1. However, according to this embodiment, the area, where the nanowires are located are etched open. compare FIG. 3a, in particular by a photolithography and etching process. One extremity of the nanowires is a free extremity, protruding of the insulating layer structure. Part of the electrically insulating layer structure 16a and 16c is removed such that the plurality of nanowires 18 protrudes from the respective electrically insulating layer structure 16a and 16c as shown in FIG. 3c. This partial removal of the electrically insulating layer structure 16a and 16c may be executed by a chemical and/or physical etching process, e.g., plasma and/or chemical desmear. Subsequently, metal, in particular a thin metal layer is deposited to form metal bonds on the free extremity of the nanowires, as depicted in step d.

Subsequently there are two possibilities depicted. Route a) shows in e-aa) that the openings are filled and subsequently the top and the bottom layer are structured e-ab). As shown in the enlarged area a nanowire 20 of the plurality of nanowires 18 has extremities 22a and 22b. The extremity 22a is inserted in the conductive layer structure 14. Additionally, the detail view shows that the area 26 is offset with respect to the main area of the conductive layer structure 14, meaning the thickness of the area is increased in the z-direction.

Alternatively, in route b) the openings are filled and the layers are subjected to pattern plating as shown in e-ba). In e-bb) only after the pattern plating, the unplated regions are etched to completely structure the top and the bottom conductive layer structures 14a and 14d.

Figures 4, 5:
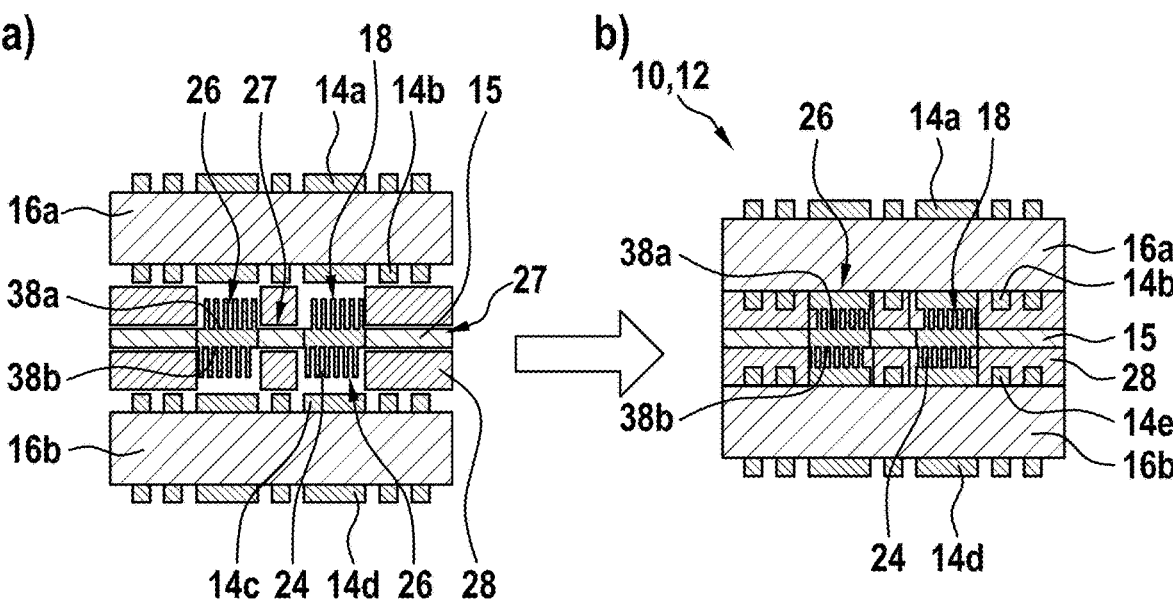
FIG. 4 shows a further embodiment of the component carrier.
FIG. 5 shows different embodiments of nanowires being arranged with an offset.

FIG. 4 shows a further embodiment of the component carrier 10. In FIG. 4a, the layers are shown separated from each other, wherein on the right the layers are stacked and/or laminated. The component carrier 10 is provided with the electrically insulating layer structures 16a, 16b. Those electrically insulating layer structures 16a, 16b are each provided with electrically conductive layer structures 14a and 14b resp. 14c and 14d. The component carrier 10 is further provided with a central electrically conductive layer structures 15 provided between the other two external electrically conductive layer structures 14a and 14d. The central electrically conductive layer structures 15 formed by an interposer body. The central electrically conductive layer structures 15 comprises two opposed surfaces 38, namely surfaces 38a, 38b. At least a plurality of nanowires 18 is provided on one of said opposed surfaces, here on surface 38a and at least a further plurality of nanowires 24 is provided on the other opposed surface 38b. The plurality of nanowires 18 and the further plurality of nanowires 24 are in this embodiment provided each in one area 26. The areas 26 on the surface 38a and on the surface 38b are aligned to each other in the stacking direction, thus vertically. Between those areas 26 the central electrically conductive layer structures 15 may comprise non-conducting areas 27 separating the areas 26. The component carrier may further comprise pre-cut prepreg 28 material, to be inserted in the areas not vertically aligned with the areas 26 to fill the space Thus the upper electrically insulating layer structures 16a with electrically conductive layer structures 14b is laminated with a prepreg 28 to the central electrically conductive layer structures 15 and the lower electrically insulating layer structures 16b with electrically conductive layer structures 14c is laminated with another prepreg 28 to the central electrically conductive layer structures 15 from the lower opposed side.

FIG. 5 shows an example of different central electrically conductive layer structures 15. The electrically conductive layer structures 15 may be formed as an interposer body. In particular, this body may comprise a substrate formed of a flexible or rigid material with conducting areas 26. In one embodiment the plurality of nanowires 18 and the further pluralities of nanowires 24 are within the same area on a top and a bottom side, as depicted in FIG. 5a. In the second embodiment as depicted in FIG. 5b the electrically conductive layer structure is provided with two bases on the opposed main surfaces 39. The nanowires are formed on bases 40. Those bases 40 are provided with an offset in the stack thickness direction with respect to the main surface of the respective electrically conductive structure 15. The bases 40 may be nanowires deposited on metal pads located on opposite sides of the interposer body. The bases 40 are connected either by means of electrical connections e. g. μ-via or PTH (plated through hole). In the embodiment as depicted in FIG. 5c additional structures are needed either to Fan-Out or Fan-in the connection pads from one side to the other of the interposer body. FIG. 5c shows the central electrically conductive layer structure 15 is provided with two bases on the opposed main surfaces 39 with different sizes. The areas 26 of the plurality of nanowires 18 and the further plurality of nanowires 24 are vertically offset 32 one each other and do not overlap. This embodiment allows for example to compensate for registration tolerances the top and the bottom circuits. FIGS. 5d to 5f show alternatives embodiments to previous 5a to c in particular having more or larger areas of nanowires. FIG. 5d shows that several groups or sub-pluralities of nanowires 34 may be arranged in one area. One of sub-pluralities of nanowires 34 overlaps partially with the further plurality of nanowires 24 on the opposing surface while the other does not overlap. The nanowires 18 or further nanowires 24 may be distributed over the total conductive area 26 or only part thereof. FIGS. 5e and 5f show embodiments where the central electrically conductive layer structure 15 is provided with two bases 40. In those embodiments sub-areas 36 are provided with sub-pluralities of nanowires 34. The sub-areas 36 are within FIGS. 5d to 5f arranged at different lateral positions.

Figure 6:
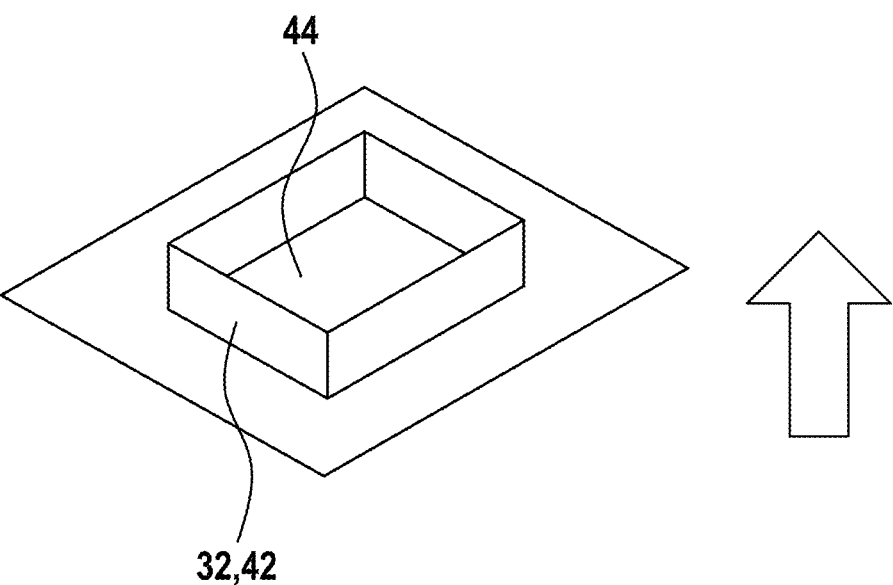
FIG. 6 shows an embodiment of the component carrier with nanowires arranged in an area.

FIG. 6 shows an example of a square like distribution area 42 forming a closed profile 32. The plurality of nanowires 18 is arranged in four sub-pluralities 34 forming a square in the distribution area 42. The square encloses in a "Cage-like" design an enclosed region or internal area 44, which is isolated from electro-magnetic interference. The inner space of the "cage" may accommodate a dielectric material or remain empty. Indeed, the nanowires arranged in the profile 32 hinder the resin flowing towards the center of the "cage" from the outer region. This process will result in a hollow region within the PCB which may act as an air cavity antenna.

While the embodiments described herein have been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 component carrier
12 stack
14 conductive layer structure
14a conductive layer structure
14b conductive layer structure
14c conductive layer structure
14d conductive layer structure
15 conductive layer structure
16 electrically insulating layer structure
16a electrically insulating layer structure
16b electrically insulating layer structure
16c electrically insulating layer structure
18 plurality of conductive nanowires
20 nanowire
22 extremity
22a first extremity
22b second extremity
24 further plurality of conductive nanowires
26 area
27 insulating area
28 prepreg
30 offset
32 profile
34 sub-plurality of nanowires
36 sub-area
38 surface
39 main surface
40 base
42 distribution area
44 internal area

What is claimed is:

1. A component carrier, wherein the component carrier comprises:
a stack comprising a plurality of electrically conductive layer structures and at least one electrically insulating layer structure, wherein at least two of said electrically conductive layer structures are connected through a plurality of metallic nanowires;
wherein each nanowire has two extremities, a first extremity of the two extremities being connected to a surface of one of said at least two of said electrically conductive layer structures;
wherein the first extremity of at least one nanowire monolithically merges with the one of the electrically conductive layer structures and wherein the at least one nanowire is grown from the surface of the one of the electrically conductive layer structures; and
wherein the at least one nanowire is formed from the same material as the one of the electrically conductive layer structures;
wherein the area where the respective plurality of nanowires is provided has a planar shape with a roughness of at least the value of a nanowire diameter.

2. The component carrier according to claim 1, wherein a second extremity of the two extremities is connected to a surface of the other of the at least two of said electrically conductive layer structures, said two surfaces facing one each other.

3. The component carrier according to claim 2, wherein the second extremity of at least one nanowire is bonded with the other one of the at least two of said electrically conductive layer structures.

4. The component carrier according to claim 2, wherein the second extremity of at least one nanowire is bonded with the other one of the at least two of said electrically conductive layer structures so that the second extremity is inserted in the other one of the at least two of said electrically conductive layer structures.

5. The component carrier according to claim 1, wherein at least one nanowire abuts against at least a portion of the other one of said electrically conductive layer structures.

6. The component carrier according to claim 1, wherein at least one nanowire connects two areas each provided on one of said two electrically conductive structures.

7. The component carrier according to claim 6, wherein at least one of said two areas is offset in a stack thickness direction with respect to a main area of the respective electrically conductive structure.

8. The component carrier according to claim 6, wherein said two areas extend along a closed profile, so that the plurality of nanowires encloses an internal area.

9. The component carrier according to claim 1, wherein the stack comprises at least three of electrically conductive layer structures divided by at least two electrically insulating layer structures, wherein the central electrically conductive layer structures provided between the other two external electrically conductive layer structures comprises two opposed surfaces, wherein at least a plurality of nanowires is provided on one of said opposed surfaces and at least a further plurality of nanowires is provided on the other opposed surface.

10. The component carrier according to claim 1, wherein between the at least two electrically conductive structures an electrically insulating layer structure is provided, said plurality of nanowires being embedded in said electrically insulating layer structure.

11. The component carrier according to claim 10, wherein between the at least two electrically conductive structures an electrically insulating layer structure is provided, delimited by the area enclosed by said nanowires.

12. The component carrier according to claim 1, wherein said plurality of nanowires comprises a plurality of vertically nanowires.

13. The component carrier according to claim 1, wherein each of said plurality of nanowires has an average diameter in the range of 10 nm to 5 μm and/or has an average length in the range of 30 nm to 100 μm.

* * * * *